United States Patent
Tsai et al.

(10) Patent No.: US 11,914,777 B2
(45) Date of Patent: Feb. 27, 2024

(54) INTEGRATED SYSTEMS WITH FORCE OR STRAIN SENSING AND HAPTIC FEEDBACK

(71) Applicant: NEXTINPUT, INC., Mountain View, CA (US)

(72) Inventors: Julius Minglin Tsai, San Jose, CA (US); Albert Bergemont, Palo Alto, CA (US); Christopher Edwards, Sunnyvale, CA (US); Ali Foughi, Atherton, CA (US)

(73) Assignee: NextInput, Inc., Mountain View, CA (US)

( * ) Notice: Subject to any disclaimer, the term of this patent is extended or adjusted under 35 U.S.C. 154(b) by 641 days.

(21) Appl. No.: 16/645,650

(22) PCT Filed: Sep. 7, 2018

(86) PCT No.: PCT/US2018/049895
§ 371 (c)(1),
(2) Date: Mar. 9, 2020

(87) PCT Pub. No.: WO2019/051189
PCT Pub. Date: Mar. 14, 2019

(65) Prior Publication Data
US 2020/0278748 A1    Sep. 3, 2020

Related U.S. Application Data

(60) Provisional application No. 62/555,238, filed on Sep. 7, 2017.

(51) Int. Cl.
*G06F 3/01* (2006.01)
*G01L 5/1627* (2020.01)
(Continued)

(52) U.S. Cl.
CPC .......... *G06F 3/016* (2013.01); *B06B 1/0644* (2013.01); *B06B 1/0688* (2013.01); *B81B 7/008* (2013.01);
(Continued)

(58) Field of Classification Search
CPC ..... G06F 3/016; H01L 41/09; H01L 41/1871; H01L 41/1873; H01L 41/1876;
(Continued)

(56) References Cited

U.S. PATENT DOCUMENTS 10,234,945 B2 * 3/2019 Levesque ................ G06F 3/016
2015/0332565 A1 11/2015 Cho et al.
(Continued)

FOREIGN PATENT DOCUMENTS

WO    2018148503 A1    8/2018
WO    2018148510 A1    8/2018
(Continued)

OTHER PUBLICATIONS

Yuan (NPL: Enhancing device design through tactile feedback, Electronic Products Mar. 25, 2011) (Year: 2011).*
(Continued)

*Primary Examiner* — Arnold M Kinkead
(74) *Attorney, Agent, or Firm* — Withrow & Terranova, P.L.L.C.

(57) ABSTRACT

Integrated systems for force or strain sensing and haptic feedback are described herein. An example force-haptic system can include a sensor chip configured to receive an applied force, where the sensor chip includes at least one sensing element and an integrated circuit. The force-haptic system can also include a haptic actuator configured to convert an electrical excitation signal into mechanical vibration. Further, the force-haptic system can include a circuit board, where the sensor chip and the haptic actuator are
(Continued)

electrically and mechanically coupled to the circuit board. The integrated circuit can be configured to process an electrical signal received from the at least one sensing element and to output the electrical excitation signal.

16 Claims, 7 Drawing Sheets

(51) Int. Cl.
    *H10N 30/20*     (2023.01)
    *H10N 30/853*     (2023.01)
    *B81B 7/00*     (2006.01)
    *B06B 1/06*     (2006.01)

(52) U.S. Cl.
    CPC ........... *G01L 5/1627* (2020.01); *H10N 30/20* (2023.02); *H10N 30/8536* (2023.02); *H10N 30/8542* (2023.02); *H10N 30/8554* (2023.02)

(58) Field of Classification Search
    CPC ... G01L 5/1627; B06B 1/0688; B06B 1/0644; H10N 30/20; H10N 30/8536; H10N 30/8542; H10N 30/8554; B81B 7/008
    USPC .......................................... 340/407.2; 310/317
    See application file for complete search history.

(56) References Cited

U.S. PATENT DOCUMENTS

| | | |
|---|---|---|
| 2016/0258758 A1 | 9/2016 | Houston et al. |
| 2016/0378190 A1* | 12/2016 | Park ........................ G06F 3/016 |
| | | 345/173 |
| 2017/0242539 A1* | 8/2017 | Mani ..................... G06F 3/0445 |

FOREIGN PATENT DOCUMENTS

| | | |
|---|---|---|
| WO | 2019018641 A1 | 1/2019 |
| WO | 2019023552 A1 | 1/2019 |

OTHER PUBLICATIONS

International Search Report and Written Opinion issued in PCT/US2018/049895, dated Oct. 24, 2018.

* cited by examiner

INTEGRATED SYSTEMS WITH FORCE OR STRAIN SENSING AND HAPTIC FEEDBACK

CROSS-REFERENCE TO RELATED APPLICATIONS

This application is a national stage application filed under 35 U.S.C. § 371 of PCT/US2018/049895 filed Sep. 7, 2018, which claims the benefit of U.S. provisional patent application No. 62/555,238, filed on Sep. 7, 2017, and entitled "A FORCE-HAPTIC SYSTEM INTEGRATION," the disclosures of which are expressly incorporated herein by reference in their entireties.

FIELD OF TECHNOLOGY

The present disclosure relates to integrated systems with force or strain sensing and haptic feedback functionality.

BACKGROUND

Force sensing buttons are gaining attraction due to their intrinsic benefits of sensing through any different surface, ease of water and moisture proofing, and ability to work with multiple force level thresholds. The force sensing buttons are therefore promising in a number of applications including, but not limited to, mobile, automotive, and industrial applications.

In many applications, the trend of implementing force sensing buttons aligns with a trend toward a single sensing surface that does not accommodate mechanical buttons. Without mechanical buttons, however, the natural haptic feedback users are normally expecting from operating mechanical buttons is eliminated. In order to mimic a similar user experience, the industry has been implementing haptic actuation functionality with force sensing buttons. However, the conventional approach is to have the sensor signal processed through an application processor before sending out an excitation signal to initiate the haptic excitation. This leads to latency in the system that can negatively affect the user experience.

SUMMARY

Described herein are integrated systems that have force or strain sensing, force level calibration, force threshold detection, and haptic excitation functionalities. Two types of sensors, force sensors and strain gauges, are considered with different implementations with respect to a sensing surface. Additionally, haptic actuator implementations and force-haptic system partition implementations are also described herein. In some implementations, full haptic feedback logic is implemented on a sensor chip. In other implementations, partial haptic feedback logic is implemented on the sensor chip.

An example force-haptic system is described herein. The force-haptic system can include a sensor chip configured to receive an applied force, a haptic actuator configured to convert an electrical excitation signal into mechanical vibration, and a circuit board. The sensor chip can include at least one sensing element and an integrated circuit. Additionally, the sensor chip and the haptic actuator can be electrically and mechanically coupled to the circuit board, and the integrated circuit can be configured to process an electrical signal received from the at least one sensing element and to output the electrical excitation signal.

In some implementations, processing the electrical signal received from the at least one sensing element can include performing calibration and force threshold detection. In other implementations, processing the electrical signal received from the at least one sensing element can include generating the electrical excitation signal.

Alternatively or additionally, the at least one sensing element can be a force sensor or a strain gauge sensor.

Alternatively or additionally, in some implementations, the haptic actuator can be a piezoelectric haptic actuator.

Optionally, the piezoelectric haptic actuator can be implemented with a bulk piezoelectric substrate. For example, the piezoelectric haptic actuator can include a bulk piezoelectric substrate having top and bottom surfaces; top and bottom electrodes disposed on the top and bottom surfaces of the bulk piezoelectric substrate, respectively; top and bottom passivation layers disposed on the top and bottom electrodes, respectively; a via configured to provide an electrical connection to the bottom electrode; and a plurality of pad openings configured to provide electrical and mechanical connection between the haptic actuator and the circuit board. The piezoelectric substrate can be made of lead zirconate titanate (PZT), lithium niobate ($LiNbO_3$), barium titanate ($BaTiO_3$), or sodium potassium niobate (KNN).

Optionally, the piezoelectric haptic actuator can be implemented with a thin film piezoelectric substrate. For example, the piezoelectric haptic actuator can include a thin film piezoelectric substrate having top and bottom surfaces; top and bottom electrodes disposed on the top and bottom surfaces of the thin film piezoelectric substrate, respectively; a passivation layer disposed on the top electrode; a via configured to provide an electrical connection to the bottom electrode; a semiconductor substrate and a dielectric layer, wherein the dielectric layer is arranged between the semiconductor substrate and the bottom electrode; and a plurality of pad openings configured to provide electrical and mechanical connection between the haptic actuator and the circuit board. The piezoelectric substrate can be made of lead zirconate titanate (PZT), lithium niobate ($LiNbO_3$), barium titanate ($BaTiO_3$), or sodium potassium niobate (KNN).

Alternatively or additionally, in other implementations, the haptic actuator can be an eccentric rotating mass (ERM) vibration motor or a linear resonance actuator (LRA).

Alternatively or additionally, the circuit board can be a flexible circuit board.

Another example force-haptic system is described herein. The force-haptic system can include a sensor chip configured to receive an applied force, an integrated circuit chip, a haptic actuator configured to convert an electrical excitation signal into mechanical vibration, and a circuit board. The sensor chip can include at least one sensing element and an integrated circuit. Additionally, the sensor chip, the integrated circuit chip, and the haptic actuator can be electrically and mechanically coupled to the circuit board. The integrated circuit can be configured to process an electrical signal received from the at least one sensing element, and the integrated circuit chip can be configured to output the electrical excitation signal.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

DETAILED DESCRIPTION

The present disclosure can be understood more readily by reference to the following detailed description, examples, drawings, and their previous and following description. However, before the present devices, systems, and/or methods are disclosed and described, it is to be understood that this disclosure is not limited to the specific devices, systems, and/or methods disclosed unless otherwise specified, and, as such, can, of course, vary. It is also to be understood that the terminology used herein is for the purpose of describing particular aspects only and is not intended to be limiting.

The following description is provided as an enabling teaching. To this end, those skilled in the relevant art will recognize and appreciate that many changes can be made, while still obtaining beneficial results. It will also be apparent that some of the desired benefits can be obtained by selecting some of the features without utilizing other features. Accordingly, those skilled in the art will recognize that many modifications and adaptations may be possible and can even be desirable in certain circumstances, and are contemplated by this disclosure. Thus, the following description is provided as illustrative of the principles and not in limitation thereof.

As used throughout, the singular forms "a," "an" and "the" include plural referents unless the context clearly dictates otherwise. Thus, for example, reference to "a force sensing element" can include two or more such force sensing elements unless the context indicates otherwise.

The term "comprising" and variations thereof as used herein is used synonymously with the term "including" and variations thereof and are open, non-limiting terms.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

The present disclosure relates to the system integration of force sensing and haptic feedback. In some implementations, the force sensing is realized with a force sensor. In other implementations, the force sensing is realized with a strain gauge sensor.

Figure 1:
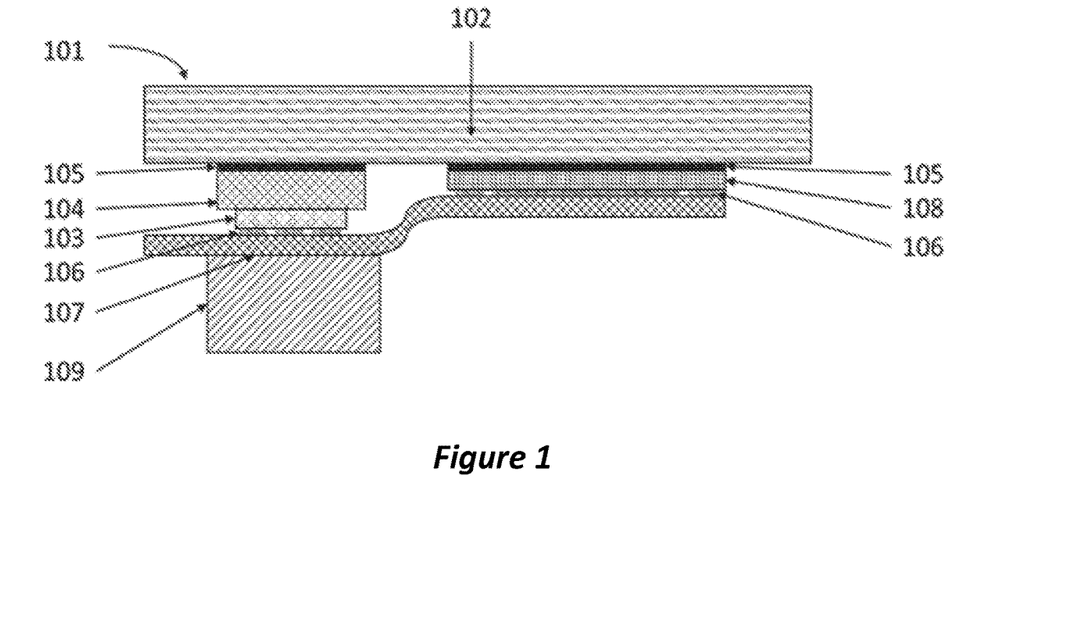
FIG. 1 illustrates an example integrated force-haptic system including a force sensor configured to implement the full functionality of haptic feedback logic.

Referring now to FIG. 1, an example force-haptic system 101 is shown. The force-haptic system 101 shown in FIG. 1 includes a force sensor 103 (sometimes referred to herein as "sensor chip") that includes at least one sensing element and digital circuitry (sometimes referred to as "integrated circuit") configured to fully implement the haptic feedback logic. Haptic feedback logic can include, but is not limited to, analog-to-digital conversion (ADC), force level calibration, force threshold detection, and/or haptic excitation functions. The digital circuitry can be configured to perform various signal conditioning functions and/or other operations as described herein. In other words, the force sensor 103 can include digital circuitry for receiving and processing the force signal detected by the sensing element(s) of the force sensor 103 and providing a control signal for driving a haptic actuator 108. By implementing haptic feedback logic with the force sensor 103, the force-haptic system's latency is reduced and therefore the user's experience is improved. Force sensors having both sensing elements and integrated circuitry are known in the art. For example, integrated force sensor chips having both sensing elements (e.g., piezoresistive and/or piezoelectric elements) and digital circuitry (e.g., integrated circuitry or CMOS circuitry) are described in WO2018/148503, published Aug. 16, 2018 and entitled "INTEGRATED DIGITAL FORCE SENSORS AND RELATED METHODS OF MANUFACTURE," and WO2018/148510, published Aug. 16, 2018 and entitled "INTEGRATED PIEZORESISTIVE AND PIEZOELECTRIC FUSION FORCE SENSOR," the disclosures of which are expressly incorporated herein by reference in their entireties. Other example integrated force sensors having both sensing elements and digital circuitry are described in PCT/US2018/042883, filed Jul. 19, 2018 and entitled "STRAIN TRANSFER STACKING IN A MEMS FORCE SENSOR," and PCT/US2018/044049, filed Jul. 27, 2018 and entitled "A WAFER BONDED PIEZORESISTIVE AND PIEZOELECTRIC FORCE SENSOR AND RELATED METHODS OF MANUFACTURE."

As discussed above, the force-haptic system 101 includes the force sensor 103 and the haptic actuator 108. The haptic actuator 108 is configured to provide haptic feedback such as mechanical vibration when activated. In some implementations, the haptic actuator 108 can be a piezoelectric haptic actuator. It should be understood that piezoelectric haptic actuators are only provided as examples and that the haptic actuator 108 can be an Eccentric Rotating Mass (ERM) vibration motor, a Linear Resonance Actuator (LRA), or other actuator that generates vibration in response to electrical excitation. The force-haptic system 101 also includes a sensing surface 102 to which the external force is applied. As shown in FIG. 1, the force sensor 103 is attached to the sensing surface 102 through a tolerance absorption layer 104 and an adhesive 105. This disclosure contemplates that the tolerance absorption layer 104 can be made of rubber or other suitable material, and that the adhesive 105 can be epoxy, tape, glue, or other suitable material. In addition, the haptic actuator 108 is attached to the sensing surface 102 with adhesive 105 and can provide haptic feedback at the sensing surface 102. Further, as shown in FIG. 1, the force-haptic system 101 can include a circuit board such as printed circuit board (PCB) 107. Optionally, the PCB 107 is a flexible PCB as shown in FIG. 1. Each of the force sensor 103 and the haptic actuator 108 are mechanically and electrically coupled to the PCB 107 through one or more metal layers 106 such as a solder bump. This disclosure contemplates that the metal layers 106 can be made of any suitable conductive material such as aluminum, copper, or gold for example. The haptic actuator 108 is electrically coupled to the force sensor 103 through the PCB 107 such that the haptic actuator 108 can receive control signals (e.g., an electrical activation signal) from the force sensor 103. A mechanical anchor 109 is attached to the PCB 107, which provides a reaction force to the force sensor 103.

Figure 2:
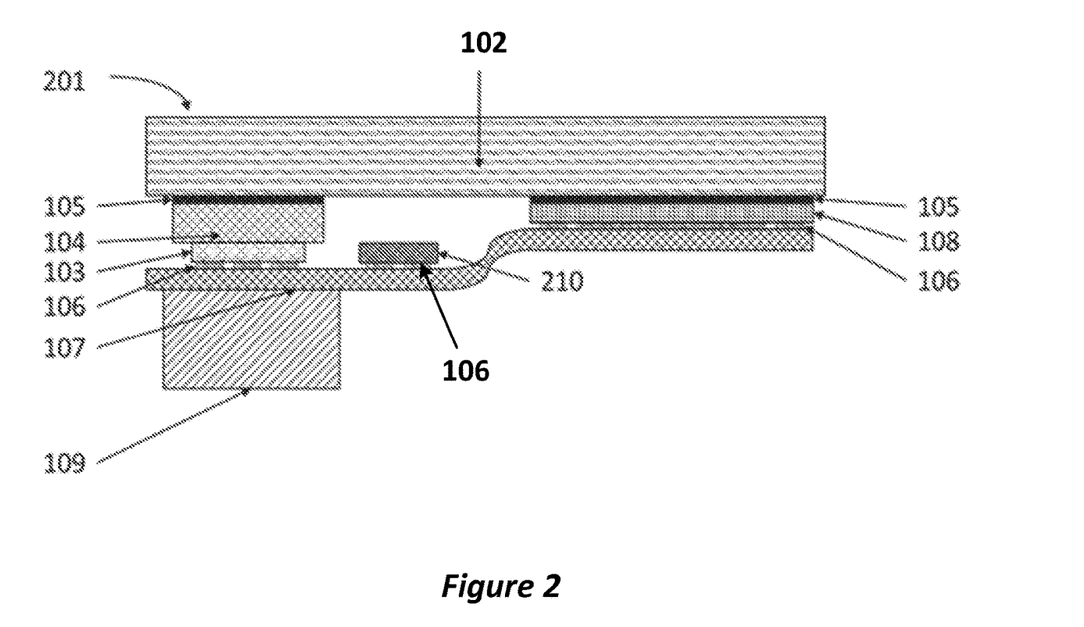
FIG. 2 illustrates another example force-haptic system including a force sensor configured to execute partial functionality of haptic feedback logic.

Referring now to FIG. 2, another example force-haptic system 201 is shown. The force-haptic system 201 shown in FIG. 2 includes a sensing surface 102, a force sensor 103, a printed circuit board (PCB) 107, and a haptic actuator 108. The force sensor 103 and the haptic actuator 108 are attached to the sensing surface 102 as described above, for example, using adhesive 105 and/or a tolerance absorption layer 104. Additionally, the force sensor 103 and the haptic actuator 108 are attached to the PCB 107 as described above, for example, using one or more metal layers 106. A mechanical anchor 109 is attached to the PCB 107, which provides a reaction force to the force sensor 103. These features are described in detail above with regard to FIG. 1 and are therefore not described in further detail below.

The force-haptic system 201 shown in FIG. 2 also includes an integrated circuit (IC) chip 210. As shown in FIG. 2, the IC chip 210 is mechanically and electrically coupled to the PCB 107 through one or more metal layers 106. The IC chip 210, the haptic actuator 108, and the force sensor 103 are electrically coupled to one another through the PCB 107 such that the IC chip 210, the haptic actuator 108, and/or the force sensor 103 can transmit/receive electrical signals. The IC chip 210 can be configured to partially implement the haptic feedback logic. This is different than the force-haptic system described with regard to FIG. 1, where the force sensor includes the digital circuitry for implementing all of the haptic feedback logic. By implementing at least some of the haptic feedback logic with the force sensor 103, the force-haptic system's latency is reduced and therefore the user's experience is improved. For example, the force sensor 103 can include digital circuitry for receiving and processing the force signal detected by the sensing element(s) of the force sensor 103. This can include performing force level calibration and/or force threshold detection algorithms. In other words, the digital circuitry on the force sensor 103 includes the sensor feedback circuitry. The force sensor 103 can be configured to transmit the processed force signal to the IC chip 210, which can be configured to perform haptic excitation algorithms. The IC chip 210 can be configured to generate and transmit a control signal (e.g., an electrical excitation signal) to the haptic actuator 108. In other words, the IC chip 210 includes the haptic driver circuitry. It should be understood that the specific algorithms performed by the force sensor 103 and the IC chip 210 are provided only as examples.

Figure 3:
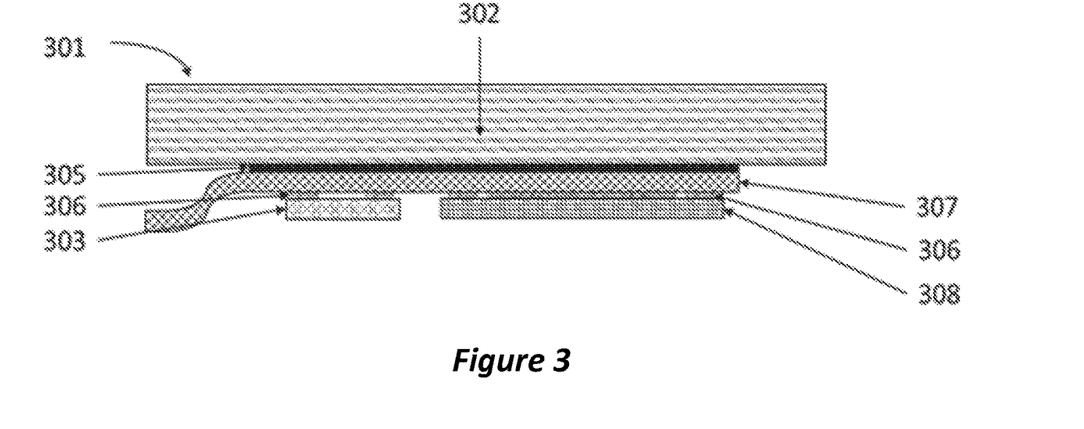
FIG. 3 illustrates an example force-haptic system including a strain gauge sensor configured to execute the full functionality of haptic feedback logic.

Referring now to FIG. 3, another example force-haptic system 301 is shown. The force-haptic system 301 shown in FIG. 3 includes a strain gauge sensor 303 (sometimes referred to herein as "sensor chip") that includes at least one sensing element and digital circuitry (sometimes referred to as "integrated circuit") configured to fully implement the haptic feedback logic. As described above, haptic feedback logic can include, but is not limited to, analog-to-digital conversion (ADC), force level calibration, force threshold detection, and/or haptic excitation algorithms. The digital circuitry can be configured to perform various signal conditioning functions and/or other operations as described herein. In other words, the strain gauge sensor 303 can include digital circuitry for receiving and processing the signal detected by the sensing element(s) of the strain gauge sensor 303 and providing a control signal for driving a haptic actuator 308. By implementing haptic feedback logic with the strain gauge sensor 303, the force-haptic system's latency is reduced and therefore the user's experience is improved. Sensor chips having both sensing elements and integrated circuitry are known in the art. For example, integrated force sensors having both sensing elements (e.g., piezoresistive and/or piezoelectric elements) and digital circuitry (e.g., integrated circuitry or CMOS circuitry) are described in WO2018/148503, published Aug. 16, 2018 and entitled "INTEGRATED DIGITAL FORCE SENSORS AND RELATED METHODS OF MANUFACTURE," and WO2018/148510, published Aug. 16, 2018 and entitled "INTEGRATED PIEZORESISTIVE AND PIEZOELECTRIC FUSION FORCE SENSOR," the disclosures of which are expressly incorporated herein by reference in their entireties. Other example integrated force sensors having both sensing elements and digital circuitry are described in PCT/US2018/042883, filed Jul. 19, 2018 and entitled "STRAIN TRANSFER STACKING IN A MEMS FORCE SENSOR," and PCT/US2018/044049, filed Jul. 27, 2018 and entitled "A WAFER BONDED PIEZORESISTIVE AND PIEZOELECTRIC FORCE SENSOR AND RELATED METHODS OF MANUFACTURE."

As discussed above, the force-haptic system 301 includes the strain gauge sensor 303 and the haptic actuator 308. The haptic actuator 308 is configured to provide haptic feedback such as mechanical vibration when activated. In some implementations, the haptic actuator 308 can be a piezoelectric haptic actuator. It should be understood that piezoelectric haptic actuators are only provided as examples and that the haptic actuator 308 can be an Eccentric Rotating Mass (ERM) vibration motor, a Linear Resonance Actuator (LRA), or other actuator that generates vibration in response to electrical excitation. The force-haptic system 301 also includes a sensing surface 302 to which the external force is applied. As shown in FIG. 3, the force-haptic system 301 can also include a circuit board such as printed circuit board (PCB) 307. Optionally, the PCB 307 is a flexible PCB as shown in FIG. 3. The PCB 307 can be attached to the sensing surface 302 through an adhesive 305. This disclosure contemplates that the adhesive 305 can be epoxy, tape, glue, or other suitable material. Each of the strain gauge sensor 303 and the haptic actuator 308 are mechanically and electrically coupled to the PCB 307 through one or more metal layers 306 such as a solder bump. This disclosure contemplates that the metal layers 306 can be made of any suitable conductive material such as aluminum, copper, or gold for example. The haptic actuator 308 is electrically coupled to the strain gauge sensor 303 through the PCB 307 such that the haptic actuator 308 can receive control signals (e.g., an electrical excitation signal) from the strain gauge sensor 303.

Figure 4:
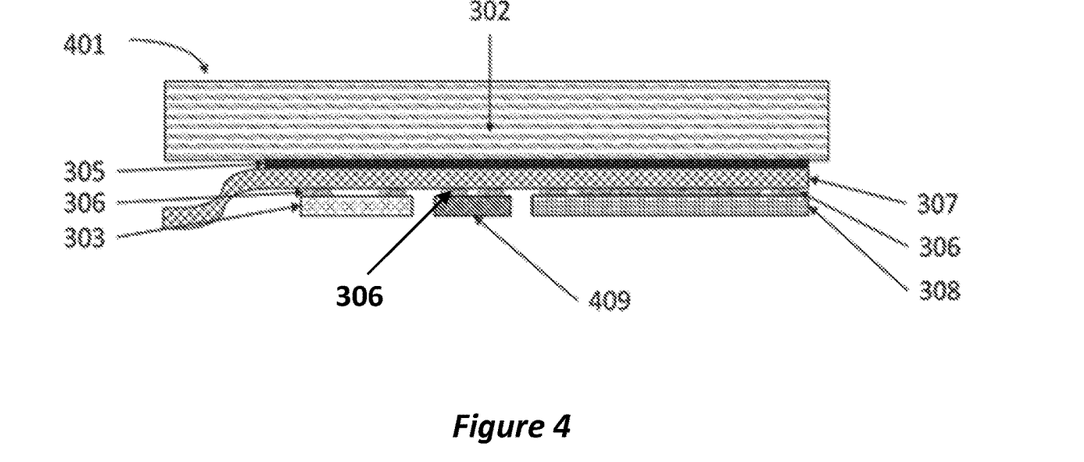
FIG. 4 illustrates another example force-haptic system including a strain gauge sensor configured to execute partial functionality of haptic feedback logic.

Referring now to FIG. 4, another example force-haptic system 401 is shown. The force-haptic system 401 shown in FIG. 4 includes a sensing surface 302, a strain gauge sensor 303, a printed circuit board (PCB) 307, and a haptic actuator 308. The strain gauge sensor 303 and the haptic actuator 308 are attached to the PCB 307 as described above, for example, using one or more metal layers 306. Additionally, the PCB 307 is attached to the sensing surface 302 as described above, for example, using adhesive 305. These features are described in detail above with regard to FIG. 3 and are therefore not described in further detail below.

The force-haptic system 401 shown in FIG. 4 also includes an integrated circuit (IC) chip 409. As shown in FIG. 4, the IC chip 409 is mechanically and electrically coupled to the PCB 307 through one or more metal layers 306. The IC chip 409, the haptic actuator 308, and the strain gauge sensor 303 are electrically coupled to one another through the PCB 307 such that the IC chip 409, the haptic actuator 308, and/or the strain gauge sensor 303 can transmit/receive electrical signals. The IC chip 409 can be configured to partially implement the haptic feedback logic. This is different than the force-haptic system described with regard to FIG. 3, where the strain gauge sensor includes the digital circuitry for implementing all of the haptic feedback logic. By implementing at least some of the haptic feedback logic with the strain gauge sensor 303, the force-haptic system's latency is reduced and therefore the user's experience is improved. For example, the strain gauge sensor 303 can include digital circuitry for receiving and processing the signal detected by the sensing element(s) of the strain gauge sensor 303. This can include performing force level calibration and/or force threshold detection algorithms. In other words, the digital circuitry on the strain gauge sensor 303 includes the sensor feedback circuitry. The strain gauge sensor 303 can be configured to transmit the processed signal to the IC chip 409, which can be configured to perform haptic excitation algorithms. The IC chip 409 can be configured to generate and transmit a control signal (e.g., an electrical excitation signal) to the haptic actuator 308. In other words, the IC chip 409 includes the haptic driver circuitry. It should be understood that the specific algorithms performed by the strain gauge sensor 303 and the IC chip 409 are provided only as examples.

Figure 5:
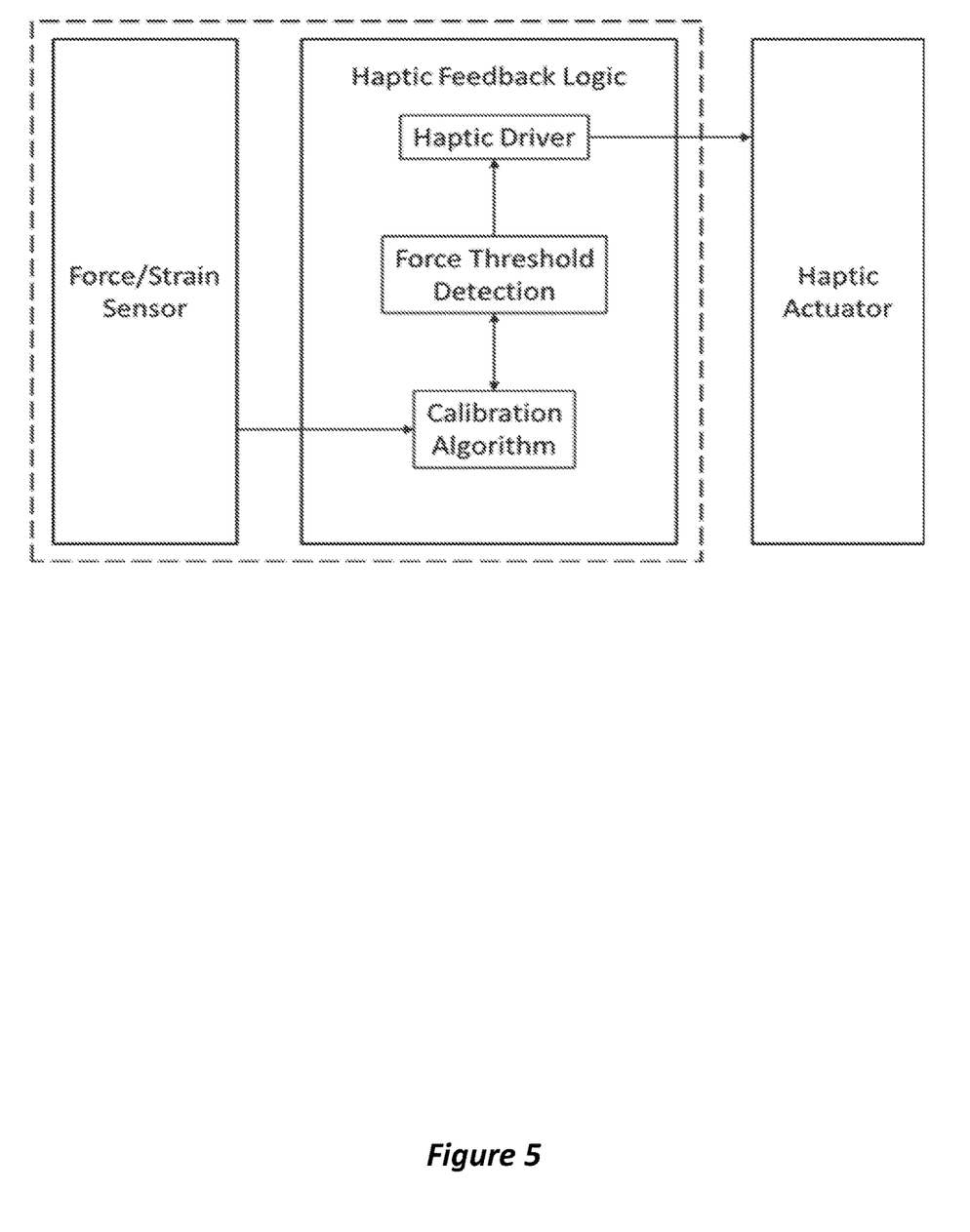
FIG. 5 is a block diagram of an example complementary metal-oxide-semiconductor (CMOS) integrated force or strain sensor with internal haptic drive.

Referring now to FIG. 5, a block diagram of an example CMOS integrated sensor (sometimes referred to as a force-haptic system) with internal haptic drive is shown. The integrated sensor can include at least one sensing element such as piezoresistive and/or piezoelectric sensing elements, which is shown as the force/strain sensor in FIG. 5. Additionally, the integrated sensor can also include CMOS circuitry (e.g., digital circuitry or integrated circuit) on the same chip. The CMOS circuitry can be configured to fully implement the haptic feedback logic as shown in FIG. 5. Haptic feedback logic can include, but is not limited to, analog-to-digital conversion (ADC), force calibration, force threshold detection, and haptic excitation functions. In FIG. 5, the CMOS circuitry includes both the sensor feedback circuitry and the haptic driver circuitry. This is different than the conventional approach because the force sensor/strain gauge sensor signal is fully processed by digital circuitry on the integrated sensor chip itself. This has advantages including, but not limited to, reducing system latency and/or improving the user's experience. For example, as shown in FIG. 5, the force sensor or strain gauge outputs an analog electrical signal when force is applied to the system. The analog signal can be converted to a digital signal with the digital circuitry. This signal is then processed by the calibration algorithm, which can include eliminating offset, temperature, and/or drift effects from the system. This disclosure contemplates that functions other than those described above can be included as part of the calibration algorithm. Following calibration, the calibrated signal is then processed by the force threshold detection algorithm. For example, the force threshold detection algorithm can determine whether the calibrated signal is equal to or exceeds a threshold value. This disclosure contemplates that the threshold value can have any value selected by the user. If not, the calibrated signal can be ignored by the system. On the other hand, when the calibrated signal is equal to or exceeds the threshold (e.g., not noise), then the calibrated signal is transmitted to the haptic driver. This disclosure contemplates that functions other than those described above can be included as part of the force threshold detection algorithm. The haptic driver can be configured to generate the electrical activation signal and transmit the electrical activation signal to the haptic actuator, for example, an actuator described above with regard to FIGS. 1 and 3. This disclosure contemplates that functions other than those described above can be included as part of the haptic driver algorithm. As described above, it should be understood that the sensing elements can be provided on the same chip (e.g., the force sensor 103 or strain gauge sensor 303 shown in FIGS. 1 and 3, respectively) as the CMOS circuitry (e.g., digital circuitry) configured to implement the above-described algorithms.

Figure 6:
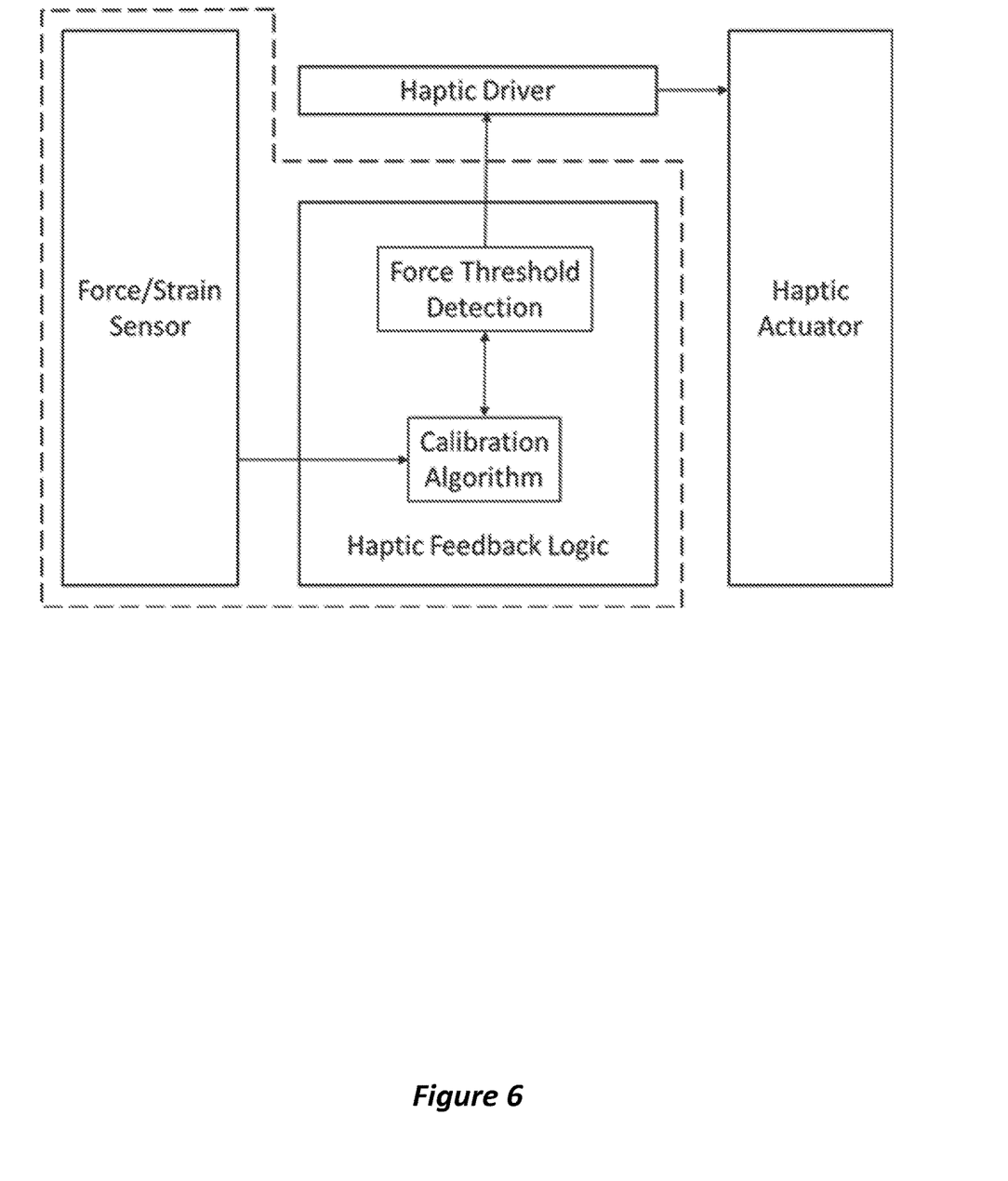
FIG. 6 is a block diagram of an example CMOS integrated force or strain sensor with external haptic drive.

Referring now to FIG. 6, a block diagram of an example CMOS integrated sensor (sometimes referred to as a force-haptic system) with external haptic drive is shown. The integrated sensor can include at least one sensing element such as piezoresistive and/or piezoelectric sensing elements, which is shown as the force/strain sensor in FIG. 6. Additionally, the integrated sensor can also include CMOS circuitry (e.g., digital circuitry or integrated circuit) on the same chip. The CMOS circuitry on the sensor chip can be configured to partially implement the haptic feedback logic as shown in FIG. 6. For example, the CMOS circuitry on the sensor chip can be configured to implement force calibration and force threshold detection algorithms. The remaining logic (e.g., haptic driver) can be implemented by an external chip such as IC chip 210 shown in FIG. 2 or IC chip 409 shown in FIG. 4. In other words, in FIG. 6, the CMOS circuitry on the sensor chip includes the sensor feedback circuitry, while the external chip includes the haptic driver circuitry. This is different than the conventional approach because the force sensor/strain gauge sensor signal is partially processed by digital circuitry on the integrated sensor chip itself. This has advantages including, but not limited to, reducing system latency and/or improving the user's experience. For example, as shown in FIG. 6, the force sensor or strain gauge outputs an analog electrical signal when force is applied to the system. The analog signal can be converted to a digital signal with the digital circuitry. This signal is then processed by the calibration algorithm, which can including eliminating offset, temperature, and/or drift effects from the system. This disclosure contemplates that functions other than those described above can be included as part of the calibration algorithm. Following calibration, the calibrated signal is then processed by the force threshold detection algorithm. For example, the force threshold detection algorithm can determine whether the calibrated signal is equal to or exceeds a threshold value. This disclosure contemplates that the threshold value can have any value selected by the user. If not, the calibrated signal is ignored by the system. On the other hand, when the calibrated signal is equal to or exceeds the threshold (e.g., not noise), then the calibrated signal is transmitted from the sensor chip to an external chip (e.g., IC chip 210 or 409 shown in FIG. 2 or 4), which implements the haptic driver. This disclosure contemplates that functions other than those described above can be included as part of the force threshold detection algorithm. The haptic driver can be configured to generate the electrical activation signal and transmit the electrical activation signal to the haptic actuator, for example, an actuator described above with regard to FIGS. 2 and 4. This disclosure contemplates that functions other than those described above can be included as part of the haptic driver algorithm. As described above, it should be understood that the sensing elements can be provided on the same chip (e.g., the force sensor 103 or strain gauge sensor 303 shown in FIGS. 1 and 3, respectively) as the CMOS circuitry (e.g., digital circuitry) configured to implement the calibration and/or force threshold detection algorithms, while the haptic driver algorithm can be implemented on an external chip.

Figure 7:
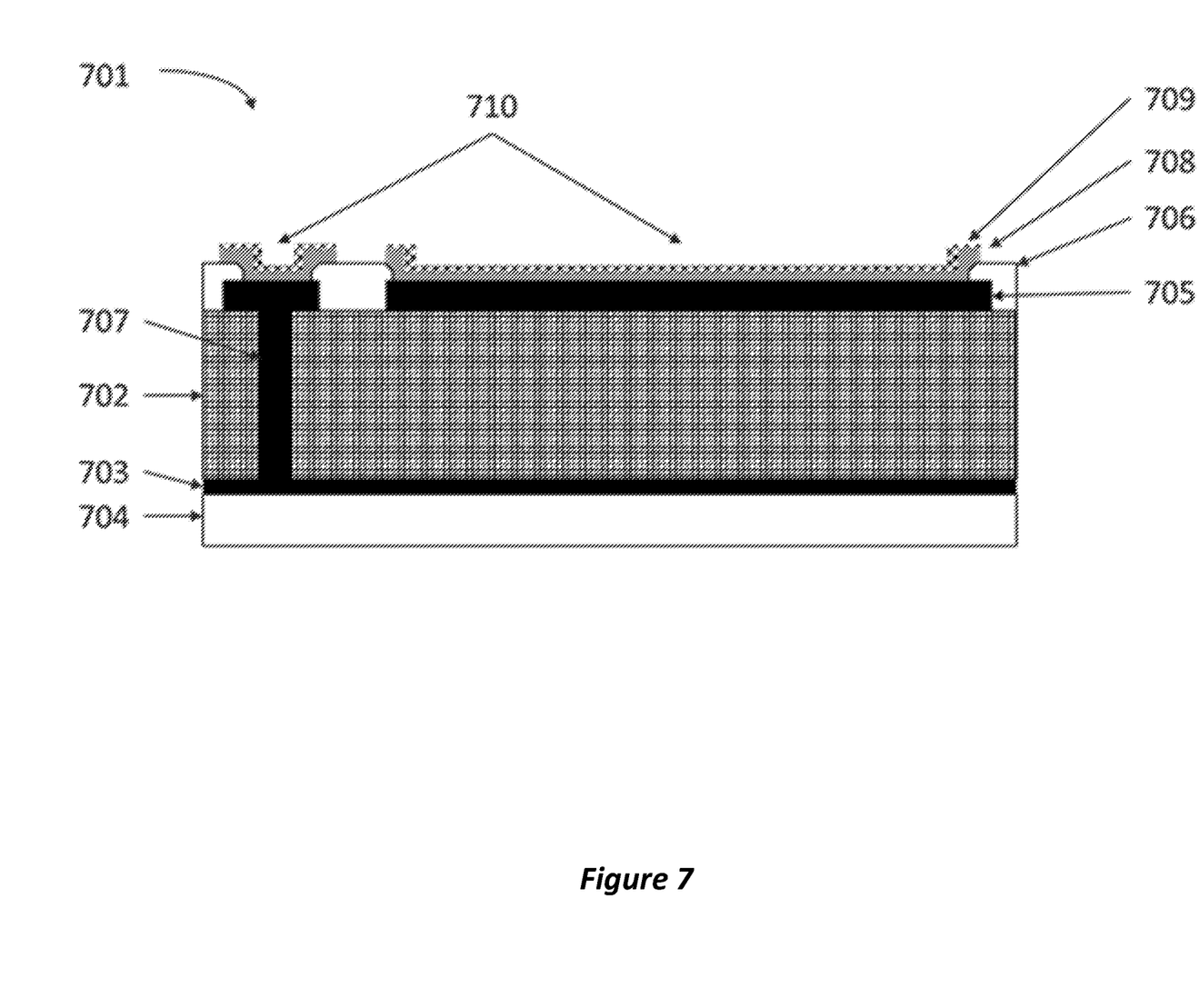
FIG. 7 illustrates a cross sectional view of an example piezoelectric haptic actuator implemented on bulk piezoelectric substrate.

Referring now to FIG. 7, a cross sectional view of an example piezoelectric haptic actuator implemented on bulk piezoelectric substrate is shown. As described above, a piezoelectric haptic actuator can optionally be used with a force-haptic system described above with regard to any one of FIGS. 1-6. It should be understood that piezoelectric haptic actuators are only provided as one example haptic actuator. This disclosure contemplates using other types of actuators that generate vibration in response to electrical excitation including, but not limited to, an Eccentric Rotating Mass (ERM) vibration motor or a Linear Resonance Actuator (LRA). In FIG. 7, the piezoelectric haptic actuator 701 is implemented with a bulk piezoelectric substrate 702. As used herein, the term "bulk" means that the thickness of the piezoelectric substrate 702 is about 90% or more of the piezoelectric haptic actuator's thickness after fabrication. The piezoelectric substrate 702 can optionally be made of lead zirconate titanate (PZT), lithium niobate (LiNbO$_3$), barium titanate (BaTiO$_3$), or sodium potassium niobate (KNN). As shown in FIG. 7, opposing electrodes—bottom electrode 703 and top electrode 705—are disposed on opposite surfaces of the piezoelectric substrate 702. Additionally, a via 707 provides an electrical connection to the bottom electrode 703. This disclosure contemplates that the electrodes and via can be made of any suitable conductive material such as aluminum, copper, or gold for example. Passivation layers—bottom passivation layer 704 and top passivation layer 706—are disposed on the opposing electrodes 703, 705 as shown in FIG. 7 and provide protection to the electrodes. This disclosure contemplates that the passivation layers can be made of any suitable passivation material such as silicon oxide, silicon nitride, or polymer for example. Further, as shown in FIG. 7, under bump metallization (UBM) 708 and metal contact layer 709 can be arranged in pad openings 710. This disclosure contemplates that the UBM and metal layer can be made of any suitable conductive material such as aluminum, copper, or gold for example. It should be understood that the number, shape, size, and/or arrangement of the pad openings are provided only as examples. This disclosure contemplates that the electrical activation signal (e.g., the signal output by the force-haptic system of any one of FIGS. 1-6) can be provided to the piezoelectric haptic actuator 701 through the metal contact layer 709. For example, that piezoelectric haptic actuator 701 can be soldered to the circuit board as shown in any one of FIGS. 1-4 at the metal contact layer 709.

Figure 8:
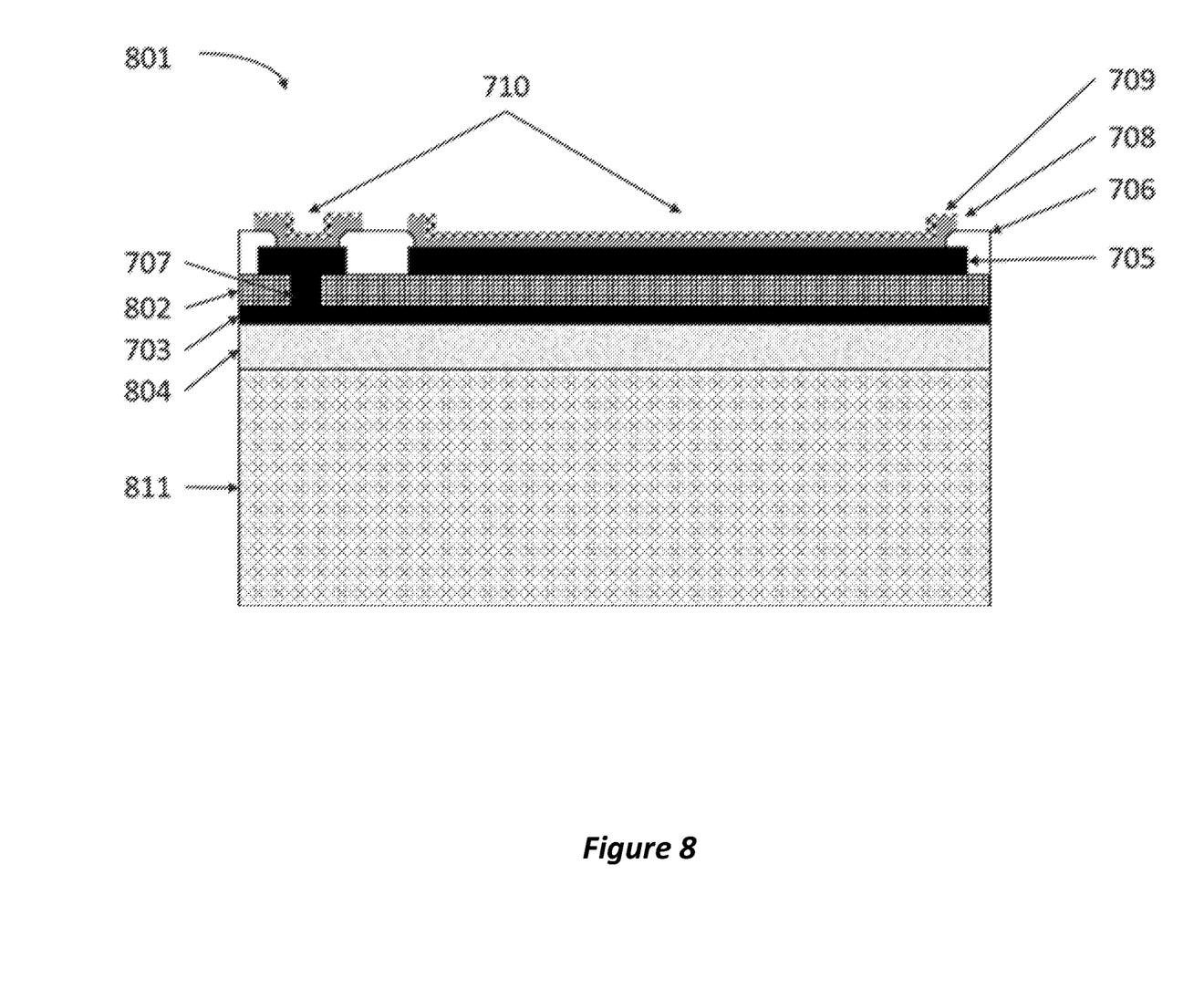
FIG. 8 illustrates a cross sectional view of an example piezoelectric haptic actuator implemented on thin film piezoelectric on silicon substrate.

Referring now to FIG. 8, a cross sectional view of an example piezoelectric haptic actuator implemented on thin film piezoelectric on silicon substrate is shown. As described above, a piezoelectric haptic actuator can optionally be used with a force-haptic system described above with regard to any one of FIGS. 1-6. It should be understood that piezoelectric haptic actuators are only provided as one example haptic actuator. This disclosure contemplates using other types of actuators that generate vibration in response to electrical excitation including, but not limited to, an Eccentric Rotating Mass (ERM) vibration motor or a Linear Resonance Actuator (LRA). In FIG. 8, the piezoelectric haptic actuator 801 is implemented with a thin film piezoelectric substrate 802. The piezoelectric substrate 802 can optionally be made of lead zirconate titanate (PZT), lithium niobate (LiNbO$_3$), barium titanate (BaTiO$_3$), or sodium potassium niobate (KNN). As used herein, the term "thin film" means that the thickness of the piezoelectric substrate 802 is about 10% or less of the piezoelectric haptic actuator's thickness after fabrication. As shown in FIG. 8, opposing electrodes—bottom electrode 703 and top electrode 705—are disposed on opposite surfaces of the piezoelectric substrate 802. Additionally, a via 707 provides an electrical connection to the bottom electrode 703. This disclosure contemplates that the electrodes and via can be made of any suitable conductive material such as aluminum, copper, or gold for example. The piezoelectric substrate 802 and electrodes 703, 705 are arranged on a semiconductor (e.g., silicon) substrate 811 with a dielectric layer 804 arranged there between. This disclosure contemplates that the dielectric layer can be made of any suitable insulation material such as silicon oxide, silicon nitride or polymer. A passivation layer—top passivation layer 706—is disposed on the top electrode 705 as shown in FIG. 8 and provides protection to the electrode. This disclosure contemplates that the passivation layer can be made of any suitable passivation material. Further, as shown in FIG. 8, under bump metallization (UBM) 708 and metal contact layer 709 can be arranged in pad openings 710. This disclosure contemplates that the UBM and metal layer can be made of any suitable conductive material such as aluminum, copper, or gold for example. It should be understood that the number, shape, size, and/or arrangement of the pad openings are provided only as examples. This disclosure contemplates that the electrical activation signal (e.g., the signal output by the force-haptic system of any one of FIGS. 1-6) can be provided to the piezoelectric haptic actuator 801 through the metal contact layer 709. For example, that piezoelectric haptic actuator 801 can be soldered to the circuit board as shown in any one of FIGS. 1-4 at the metal contact layer 709.

Figure 9:
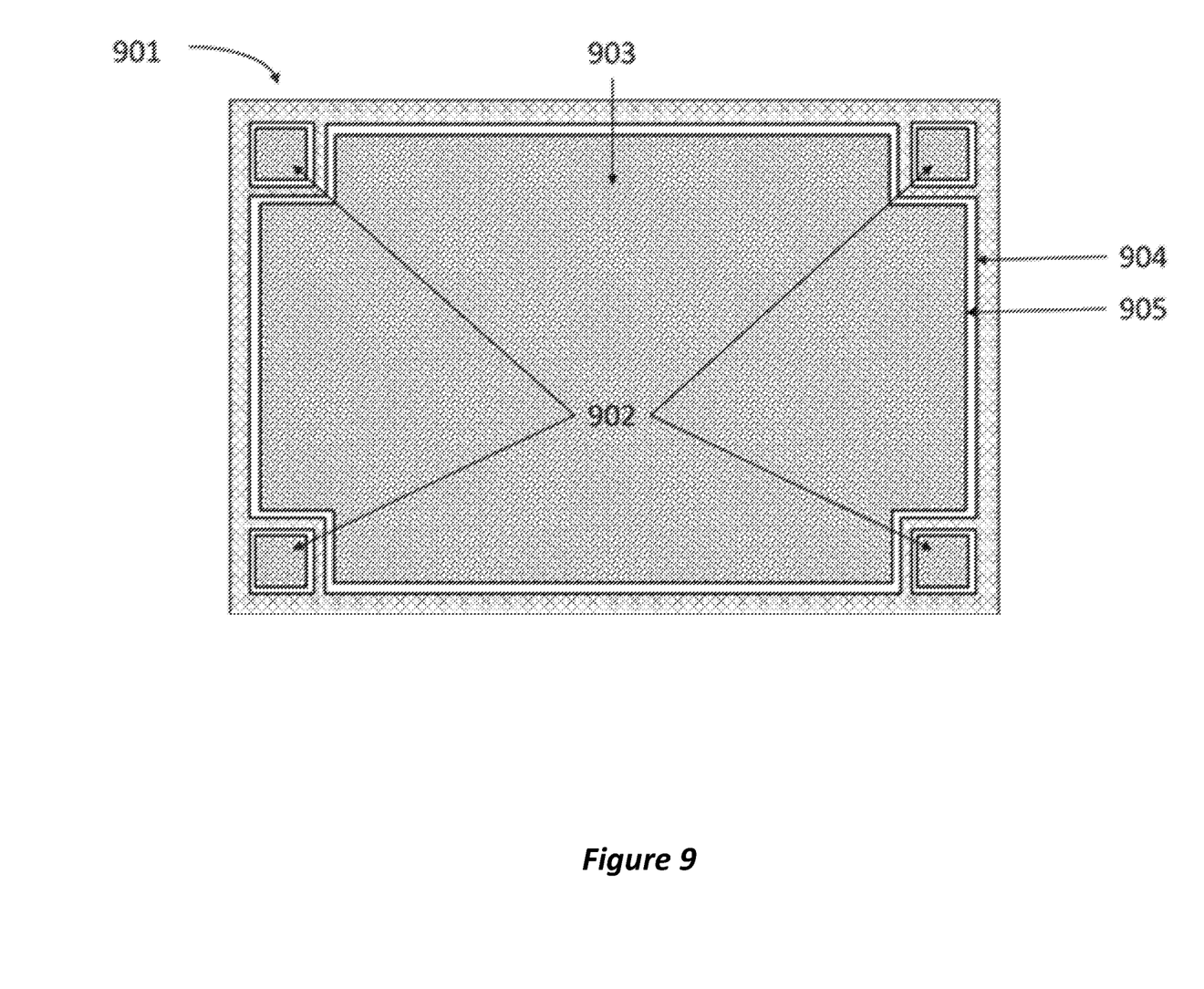
FIG. 9 illustrates a top view of a foot print of an example piezoelectric haptic actuator.

Referring now to FIG. 9, a top view of a foot print of the piezoelectric haptic actuator shown in either FIG. 7 or FIG. 8 is shown. In the example layout 901, the bottom electrode pins 902 provide the electrical connection to the bottom electrodes (e.g., electrode 703 shown in FIGS. 7 and 8) through vias (e.g., via 707 shown in FIGS. 7 and 8). The pins 902 are placed at the corners of the piezoelectric haptic actuator to minimize the non-actuation electrode area ratio. The majority of the top electrode (e.g., electrode 705 shown in FIGS. 7 and 8) is patterned for the actuation pin(s) 903. The shape of the actuation pin(s) 903 can vary depending on the shape of the piezoelectric haptic actuator and/or the desire for maximum actuation. As shown in FIG. 9, both the bottom electrode pins 902 and actuation pin(s) 903 can be formed using two layers, e.g., electrode layer 904 and passivation layer 905.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A force-haptic system, comprising:
    a sensor chip configured to receive an applied force, the sensor chip connected to a sensing surface and comprising at least one sensing element and an integrated circuit;
    a haptic actuator connected to the sensing surface and configured to convert an electrical excitation signal into a mechanical vibration, wherein the haptic actuator is a piezoelectric haptic actuator;
    a circuit board below the sensing surface and electrically and mechanically connected to the sensor chip and the haptic actuator, wherein the integrated circuit is configured to process an electrical signal received from the at least one sensing element and to output the electrical excitation signal; and
    wherein the piezoelectric haptic actuator comprises:
        a bulk piezoelectric substrate having top and bottom surfaces;
        top and bottom electrodes disposed on the top and bottom surfaces of the bulk piezoelectric substrate, respectively;
        top and bottom passivation layers disposed on the top and bottom electrodes, respectively;
        a via configured to provide an electrical connection to the bottom electrode; and
        a plurality of pad openings configured to provide electrical and mechanical connection between the haptic actuator and the circuit board.

2. The force-haptic system of claim 1, wherein processing the electrical signal received from the at least one sensing element comprises performing calibration and force threshold detection.

3. The force-haptic system of claim 1, wherein processing the electrical signal received from the at least one sensing element comprises generating the electrical excitation signal.

4. The force-haptic system of claim 1, wherein the at least one sensing element is a force sensor or a strain gauge sensor.

5. The force-haptic system of claim 1, wherein the piezoelectric substrate is made of lead zirconate titanate (PZT), lithium niobate (LiNbO3), barium titanate (BaTiO3), or sodium potassium niobate (KNN).

6. The force-haptic system of claim 1, wherein the haptic actuator is an eccentric rotating mass (ERM) vibration motor or a linear resonance actuator (LRA).

7. The force-haptic system of claim 1, wherein the circuit board is a flexible circuit board.

8. A force-haptic system, comprising:
    a sensing surface configured to receive an external force;
    a sensor chip connected to the sensing surface and configured to receive an applied force, the sensor chip comprising at least one sensing element and an integrated circuit;
    an integrated circuit chip;
    a haptic actuator connected to the sensing surface and configured to convert an electrical excitation signal into mechanical vibration, wherein the haptic actuator is a piezoelectric haptic actuator;
    a circuit board below the sensing surface, wherein:
        the sensor chip, the integrated circuit chip, and the haptic actuator are electrically and mechanically coupled to the circuit board;
        the integrated circuit is configured to process an electrical signal received from the at least one sensing element; and
        the integrated circuit chip is configured to output the electrical excitation signal; and
    wherein the piezoelectric haptic actuator comprises:
        a bulk piezoelectric substrate having top and bottom surfaces;
        top and bottom electrodes disposed on the top and bottom surfaces of the bulk piezoelectric substrate, respectively;
        top and bottom passivation layers disposed on the top and bottom electrodes, respectively;
        a via configured to provide an electrical connection to the bottom electrode; and
        a plurality of pad openings configured to provide electrical and mechanical connection between the haptic actuator and the circuit board.

9. The force-haptic system of claim 8, wherein processing the electrical signal received from the at least one sensing element comprises performing calibration and force threshold detection.

10. The force-haptic system of claim 8, wherein the integrated circuit chip is configured to generate the electrical excitation signal.

11. The force-haptic system of claim 8, wherein the at least one sensing element is a force sensor or a strain gauge sensor.

12. The force-haptic system of claim 8, wherein the piezoelectric substrate is made of lead zirconate titanate (PZT), lithium niobate (LiNbO3), barium titanate (BaTiO3), or sodium potassium niobate (KNN).

13. The force-haptic system of claim 8, wherein the haptic actuator is an eccentric rotating mass (ERM) vibration motor or a linear resonance actuator (LRA).

14. The force-haptic system of claim 8, wherein the circuit board is a flexible circuit board.

15. A force-haptic system, comprising:
    a sensor chip configured to receive an applied force, the sensor chip connected to a sensing surface and comprising at least one sensing element and an integrated circuit;
    a haptic actuator connected to the sensing surface and configured to convert an electrical excitation signal into mechanical vibration, wherein the haptic actuator is a piezoelectric haptic actuator;
    a circuit board below the sensing surface and electrically and mechanically connected to the sensor chip and the haptic actuator, wherein the integrated circuit is configured to process an electrical signal received from the at least one sensing element and to output the electrical excitation signal; and
    wherein the piezoelectric haptic actuator comprises:
        a thin film piezoelectric substrate having top and bottom surfaces;
        top and bottom electrodes disposed on the top and bottom surfaces of the thin film piezoelectric substrate, respectively;
        a passivation layer disposed on the top electrode;
        a via configured to provide an electrical connection to the bottom electrode;

a semiconductor substrate and a dielectric layer, wherein the dielectric layer is arranged between the semiconductor substrate and the bottom electrode; and a plurality of pad openings configured to provide electrical and mechanical connection between the haptic actuator and the circuit board.

16. The force-haptic system of claim 15, wherein the piezoelectric substrate is made of lead zirconate titanate (PZT), lithium niobate (LiNbO3), barium titanate (BaTiO3), or sodium potassium niobate (KNN).

* * * * *